United States Patent [19]

Miura

[11] Patent Number: 5,754,485
[45] Date of Patent: May 19, 1998

[54] DUAL PORT MEMORY APPARATUS OPERATING A LOW VOLTAGE TO MAINTAIN LOW OPERATING CURRENT DURING CHARGING AND DISCHARGING

[75] Inventor: Kiyoshi Miura, Kanagawa, Japan

[73] Assignee: Sony Corporation, Japan

[21] Appl. No.: 697,170

[22] Filed: Aug. 20, 1996

Related U.S. Application Data

[63] Continuation of Ser. No. 346,179, Nov. 22, 1994, abandoned.

[30] Foreign Application Priority Data

Nov. 25, 1993 [JP] Japan ................................ 5-295737

[51] Int. Cl.⁶ ................................................ G11C 7/00
[52] U.S. Cl. ........................... 365/203; 365/104; 365/154
[58] Field of Search .................................. 365/203, 104, 365/154

[56] References Cited

U.S. PATENT DOCUMENTS

| | | | |
|---|---|---|---|
| 4,661,931 | 4/1987 | Flannagan et al. | 365/203 |
| 4,665,507 | 5/1987 | Gondou et al. | 365/203 |
| 4,856,106 | 8/1989 | Teraoka | 365/203 |
| 4,903,235 | 2/1990 | Kubota et al. | 365/104 |
| 4,984,201 | 1/1991 | Sato et al. | 365/203 |
| 5,305,258 | 4/1994 | Koshizuka | 365/154 |
| 5,384,486 | 1/1995 | Konno | 257/752 |

FOREIGN PATENT DOCUMENTS 59-186196  10/1984  Japan .................................. 365/203

*Primary Examiner*—Vu A. Le
*Attorney, Agent, or Firm*—Ronald P. Kananen

[57] ABSTRACT

A semiconductor memory apparatus able to operate at a low voltage and thus preventing an increase of the operating current during charging and discharging. NMOS transistors are connected to the power supply line and bit lines, and the gates thereof are connected to a precharge signal supply line. PMOS transistors are connected to the connection points of the bit lines and sense amplifiers and the supply line of the power supply voltage. The gates thereof are connected to the precharge signal supply line through inverters. Transfer gates are connected to the connection points of the bit lines and the NMOS transistors. The gates thereof are connected to the column switch signal supply line. Only one bit line of the selected column is precharged to the power supply voltage level. The other bit lines are held at the predetermined low potential.

12 Claims, 7 Drawing Sheets

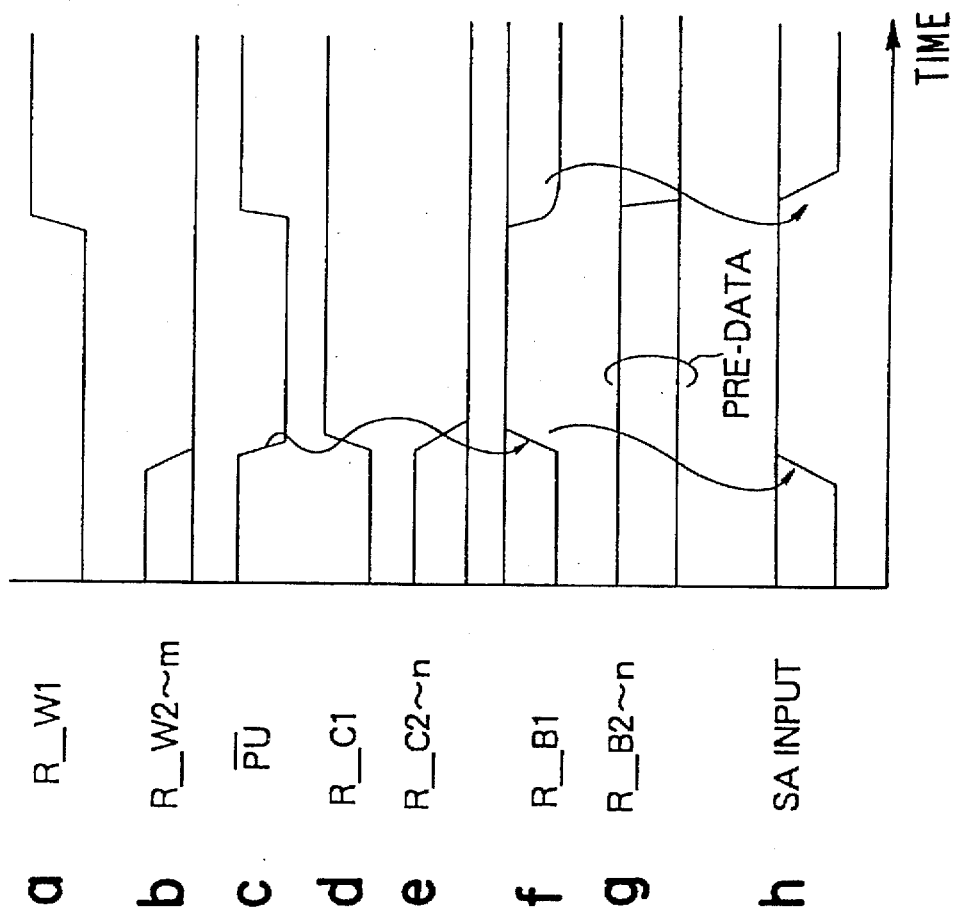

DUAL PORT MEMORY APPARATUS OPERATING A LOW VOLTAGE TO MAINTAIN LOW OPERATING CURRENT DURING CHARGING AND DISCHARGING

This application is a continuation of application Ser. No. 08/346,179 filed Nov. 22, 1994 now abandoned.

BACKGROUND OF THE INVENTION

1. Field of the Invention

The present invention relates to a semiconductor memory apparatus for precharging bit lines at a predetermined electric potential to read data therefrom.

2. Description of the Related Art

FIG. 1 is a circuit diagram of an example of the configuration of a static random access memory (SRAM). The drawing shows an example of a dual port SRAM having a single bit line to which precharging is performed. No writing circuit is shown in this drawing.

In FIG. 1, CELL(1,1) to CELL(m,n) represent SRAM cells arranged in a matrix of m lines and n rows, R_B1 and R_B2 to R_B$_n$ represent read bit lines, R_W1 and R_WB2 to R_W$_m$ represent read word lines, W_W1 and W_W2 to W_W$_m$ represent write word lines, NT$_{PR1}$ and NT$_{PR2}$ to NT$_{PRn}$ represent n-channel (N) metal oxide film semiconductor (NMOS) transistors for precharging the bit lines, NTSA$_{PR1}$ represents a NMOS transistor for precharging an input node of a sense amplifier, NT$_{SW1}$ and NT$_{SW2}$ to NT$_{SWn}$ represent NMOS transistors serving as column switches, PU represents a precharge signal supply line, R_C1 and R_C2 to R_Cn represent column switch supply lines, and SA represents a sense amplifier.

In FIG. 1, the SRAM cells CELL (1,1) to CELL (m,n) are TFT load type memory cells. Each, for example, the SRAM CELL (1,1), comprises a flip-flop including a pair of complementary (C) MOS inverters INV$_{CL1}$ and INV$_{CL2}$, inputs and outputs thereof being connected a cross-wise.

The memory nodes, which are outputs of the inverters INV$_{CL1}$ in the SRAM cells CELL (1,1) to CELL (m,n), are connected to the read bit lines R_B1, R_B2 to R_Bn through the word transistors R_WT. The gates of the respective word transistors R_WT are connected to the read word lines R_W1 and R_W2 to R_Wm respectively.

The outputs of the respective inverters INV$_{CL1}$ and the outputs of the inverters INV$_{CL2}$ are connected to write bit lines, not shown, through the word transistors W_WT1 and W_WT2, respectively. The gates of the word transistors W_WT1 and W_WT2 are connected to the write word lines W_W1 and W_W2 to W_Wm, respectively.

Specifically, the SRAM cells CELL(1,1) and CELL(2,1) to CELL(m,1) are connected to the bit line R_B1 through the respective word transistors R_WT, the SRAM cells CELL(1,2) and CELL(2,2) to CELL(m,2) are connected to the bit line R_B2 through the respective word transistors R_WT, and the SRAM cells CELL(1,n) and CELL(2,n) to CELL(m,n) are connected to the bit line R_Bn through the respective word transistors R_WT.

Also, the SRAM cells CELL(1,1) and CELL(1,2) to CELL(1,n) are connected to the read word line R_W1 and the write word line W_W2, the SRAM cells CELL(2,1) and CELL(2,2) to CELL(2,n) are connected the read word line R_W2 and the write word line EW2, and the SRAM cells CELL(m,1) and CELL(m,2) to CELL(m,n) are connected to the read word line R_Wm and the write word line W_Wm.

The drains of the precharging NMOS transistors NT$_{PR1}$ and NTPR$_2$ to NT$_{PRn}$ are connected to the power supply lines of the power supply voltage Vdd, and gates of the NMOS transistors NT$_{PR1}$ and NT$_{PR2}$ to NT$_{prn}$ are connected to the common precharge signal supply line PU.

The source of the NMOS transistor NT$_{PR1}$ is connected to the bit line R_B1, the source of the NMOS transistor NT$_{PR2}$ is connected to the bit line R_B2, and the source of the NMOS transistor NT$_{PRn}$ is connected to the bit line R_Bn.

The NMOS transistor NT$_{SW1}$ used as a column switch is provided between a connection point of the bit line R_B1 and the source of the NMOS transistor NT$_{PR1}$ and a connection point of the bit line R_B1 and the sense amplifier SA. The gate of the NMOS transistor NT$_{SW1}$ is connected to the column switch signal supply line R_C1.

The NOS transistor NT$_{SW2}$ used as a column switch is provided between a connection point of the bit line R_B2 and the source of the NOMS transistor NTPR$_2$ and a connection point of the bit line R_B2 and the same amplifier SA. The gate of the NMOS transistor NT$_{SW2}$ is connected to the column switch signal supply line R_C2.

The NMOS transistor NT$_{SWn}$ used as a column switch is provided between a connection point of the bit line R_Bn and the source of the NMOS transistor NT$_{PRn}$ and a connection point of the bit line R_Bn and the sense amplifier SA. The gate of the NMOS transistor NT$_{SWn}$ is connected to the column switch signal supply line R_Cn.

The drain of the NMOS transistor NTSA$_{PR1}$ for precharging the input node of the sense amplifier SA is connected to the supply line of the power supply voltage vdd, the source of the NMOS transistor NTSA$_{PR1}$ is connected to the node ND$_{SA}$, which is a connection point between the bit lines R_B1 and R_B2 to R_Bn and the sense amplifier SA, and the gate of the NMOS transistor NTSA$_{PR1}$ is connected to the precharge signal supply line PU.

The sense amplifier SA is comprised of inverters INV$_{SA1}$ INV$_{SA2}$ and an NMOS transistor NT$_{ST1}$.

The inverter INV$_{SA1}$ and the inverter INV$_{SA2}$ are connected in series, the input of the inverter INV$_{SA1}$ is connected to the node ND$_{SA}$ which is a connection point between the bit lines R_B1 and R_B2 to R_Bn and the NMOS transistor NTSA$_{PR1}$, and to the source of the NMOS transistor NT$_{SA1}$. The output of the inverter INV$_{SA2}$ functions as the output of the sense amplifier SA, and the output of the inverter INV$_{SA2}$ is connected to the gate of the NMOS transistor ST$_{SA1}$. The drain of the NMOS transistor NT$_{SA1}$ is connected to the supply line of the power supply voltage Vdd.

Next, an explanation will be made of the data read operation of the circuit shown in FIG. 1 with reference to the timing chart in FIG. 2.

First, the read word lines R_W1 to R_Wn are set to the low level, and the precharge signal supply line PU is set to the high level.

As a result, the precharging NMOS transistors NT$_{PR1}$ to NT$_{PRn}$ are turned on. The respective bit lines R_B1 to R_Bn are precharged at high level. Note that, an actual precharge level is defined as (Vdd−Vth−ΔVth). Here, Vth is the threshold voltage of the transistors, and ΔVth is the change of the threshold due to the substrate bias effect.

Also, since the precharge signal supply line PU is set to high level, the NMOS transistor NTSA$_{PR1}$ is turned on, and the connection point between each of the read bit lines R_B1 to R_Bn and the sense amplifier SA, namely, the input node ND$_{SA}$ of the sense amplifier SA, is precharged at a high level.

Next, the level of the precharge signal supply line PU is changed from the high level to the low level, and the read word line R_Wi selected by the address signal is set to the high level. As a result, the NMOS transistors $NT_{PR1}$ to $NT_{PRn}$ and $NTSA_{PR1}$ are turned OFF.

In response to the data stored in the SRAM cells CELL (i,1) to CELL(i,n) which are connected to the read word line R_Wi set at a high level, the respective read bit lines R_B1 to R_Bn are discharged to a low level or are held at a high level.

One of n rows of the column switch signal supply bias R_C1 to R_Cn is set to the high level in accordance with the column address signal. As a result, one column switch NMOS transistor, whose gate is connected to the column switch signal supply line set to the high level, is turned ON, and the signal passing through the column switch NMOS transistor is input to the inverter $INV_{SA1}$ in the sense amplifier SA.

In the above-mentioned apparatus, however, when the power supply voltage Vdd becomes low, the resultant precharge level is lowered, and, as a result, the sense amplifier SA may not amplify the input signal as in normal times.

When the sense amplifier SA is of a type of a sense amplifier in which a gate of an NMOS transistor receives the input signal, for example, a CMOS inverter, the high level input signal applied to the gate must be higher than the threshold voltage Vth of the transistor. That is, to ensure the normal operation of the sense amplifier SA, the following relationship must be satisfied:

$$(Vdd-Vth-\Delta Vth \geq Vth)$$

$$\therefore (Vdd \geq 2Vth+\Delta Vth)$$

This, however, means that the sense amplifier SA cannot operate normally at the low power supply voltage.

As shown in FIG. 3, there has been proposed a circuit in which the precharging of the bit lines is carried out by p-channel MOS (PMOS) transistors $PT_{PR1}$ to $PT_{PRn}$ and $PTSA_{PR1}$, instead of the NMOS transistors. In the circuit, the column switches are comprised of transfer gates $TFG_{SW1}$ to $TFG_{SWn}$, which are comprised of NMOS transistors and PMOS transistors, with their source and their drains mutually connected, instead of the NMOS transistors. The respective gates of the NMOS transistors $N_1$ to $N_n$ in the transfer gates $TFG_{SW1}$ to $TFG_{SWn}$ are directly connected to the column switch signal supply lines R_C1 to R_Cn. The gates of the PMOS transistors $P_1$ to $P_n$ in the transfer gates $TFG_{SW1}$ to $TFG_{SWn}$ are connected to the column switch supply lines R_C1 to R_Cn through the inverters $INV_{SW1}$ to $INV_{SWn}$.

In this circuit, the power supply voltage by which the high level signal to the sense amplifier exceeds the threshold voltage Vth is Vdd>Vth. Thus, in this circuit, as compared with NMOS transistors, the sense amplifier can operate at a low level power supply voltage.

But in this case, since the bit line amplitude is increased from (Vdd-Vth-$\Delta$Vth) to Vdd, it suffers from the disadvantages of the increase of the operating current of the bit lines by charging and discharging.

SUMMARY OF THE INVENTION

An object of the present invention is to provide a semiconductor memory device operable at a low voltage and thus able to operate with a low power supply by avoiding the increase of the operating current due to charging and discharging.

To achieve the above object, the present invention provides a semiconductor memory apparatus which comprises a plurality of bit lines connected to memory cells, a plurality of n-channel metal insulation film semiconductor (NMIS) transistors connected to a power source and the bit lines, the gates thereof being supplied with a common recharge signal, a p-channel type metal insulation film semiconductor (PMIS) transistor connected to a connection point of the power source line and all bit lines, the gate thereof being supplied with the precharge signal, and a plurality of column switches connected to a connection point of the bit lines and the NMIS transistors and a connection point of all bit lines and the PMIS transistor, wherein only one column switch connected to the bit line of the selected column among the column switches is set to a conductive state.

Also, the present invention provides a semiconductor memory apparatus which comprises a plurality of bit lines, a plurality of memory cells each including first and second transistors connected in series between the bit line and the first power source line, the gate of the first transistor connected to the word line, and the gate of the second transistor connected to a memory node, a PMIS transistor connected to the second power source and all bit lines, the gate thereof being supplied with a precharge signal, and a plurality of column switches connected to connection points of the bit lines and the first transistor and connection points of all bit lines and the PMIS transistor respectively, wherein only one column switch connected to the bit line of the selected column among the column switches is set to a conductive state.

According to the present invention, a high level precharge signal is supplied to each gate of the NMIS transistors, and the column switch connected to the bit line of the selected column is set to the conductive state. As a result, all NMIS transistor are turned ON, and the bit lines are precharged to a high level.

The actual precharge level of the bit lines is (Vdd-Vth-$\Delta$Vth). Here, Vth is the threshold voltage of the transistor, and $\Delta$Vth is the change of the threshold value due to the substrate bias effect.

Also, the gate of the PMIS transistor is supplied with a signal having a phase inverted from that of the precharge signal. As a result, the PMIS transistor is turned ON.

Consequently, on the terminal sides of the bit lines, for example, the connecting node between each of the bit lines and the sense amplifier is precharged to the power supply voltage level. At this time, as only one column switch in the bit lines of the selected column, among the column switches provided in the bit lines, is made conductive, the level of the selected bit line becomes the power supply voltage level, and the level of other bit lines are held at the level (Vdd-Vth-$\Delta$Vth).

Next, the precharge signal is changed from a high level to a low level, and the word line selected by a address signal is set to a high level. As a result, the NMIS and PMIS transistors are turned OFF.

In accordance with the data stored in the memory cells connected to the word line set to a high level, the bit lines are discharged to a low level or are held at a high level.

Further, according to the present invention, all bit lines are not precharged to the predetermined potential at the read operation, so the data stored in the memory cells are not destroy by the provision of the second transistor. Thus, only one bit line of the selected column is precharged.

Namely, a low level precharge signal is applied to the PMIS transistor, and only one column switch connected to the bit line of the selected column is set to the conductive state.

As a result, the PMIS transistor is turned ON, and only one bit line of the selected column is precharged to the second power supply voltage level. At this time, the previous data remains on other bit lines.

BRIEF DESCRIPTION OF THE DRAWINGS

These and other objects and features of the present invention will become more apparent from the following more detailed description of the preferred embodiments with reference to the accompanying drawings, in which:

FIG. 7 is a timing chart for explaining the operation of the circuit in FIG. 6.

DESCRIPTION OF THE PREFERRED EMBODIMENTS

Preferred embodiments of the present invention will now be explained in detail with reference to the drawings.

Figure 1:
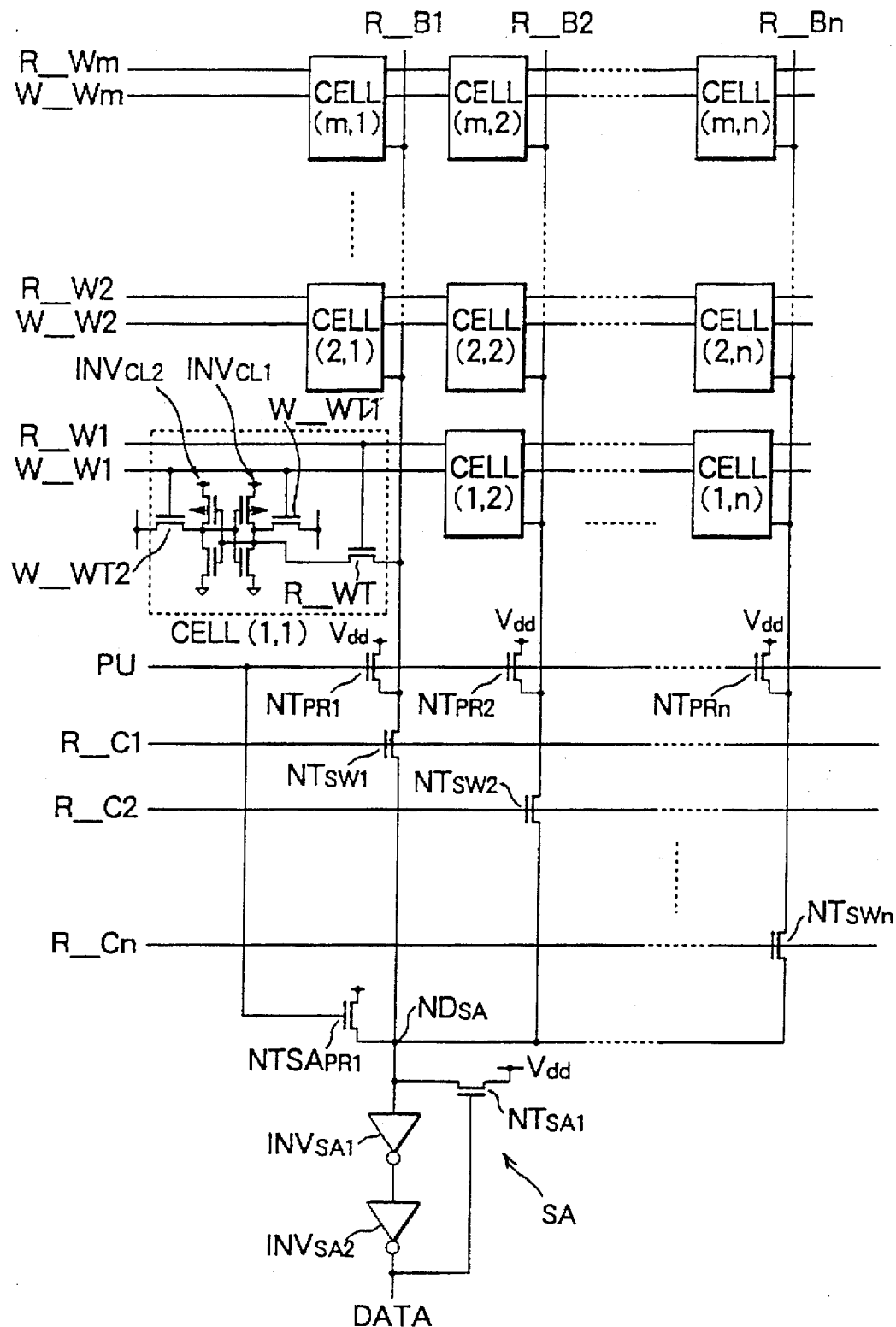
FIG. 1 is a circuit diagram of the first example of a semiconductor memory apparatus of the related art.
Figure 2:
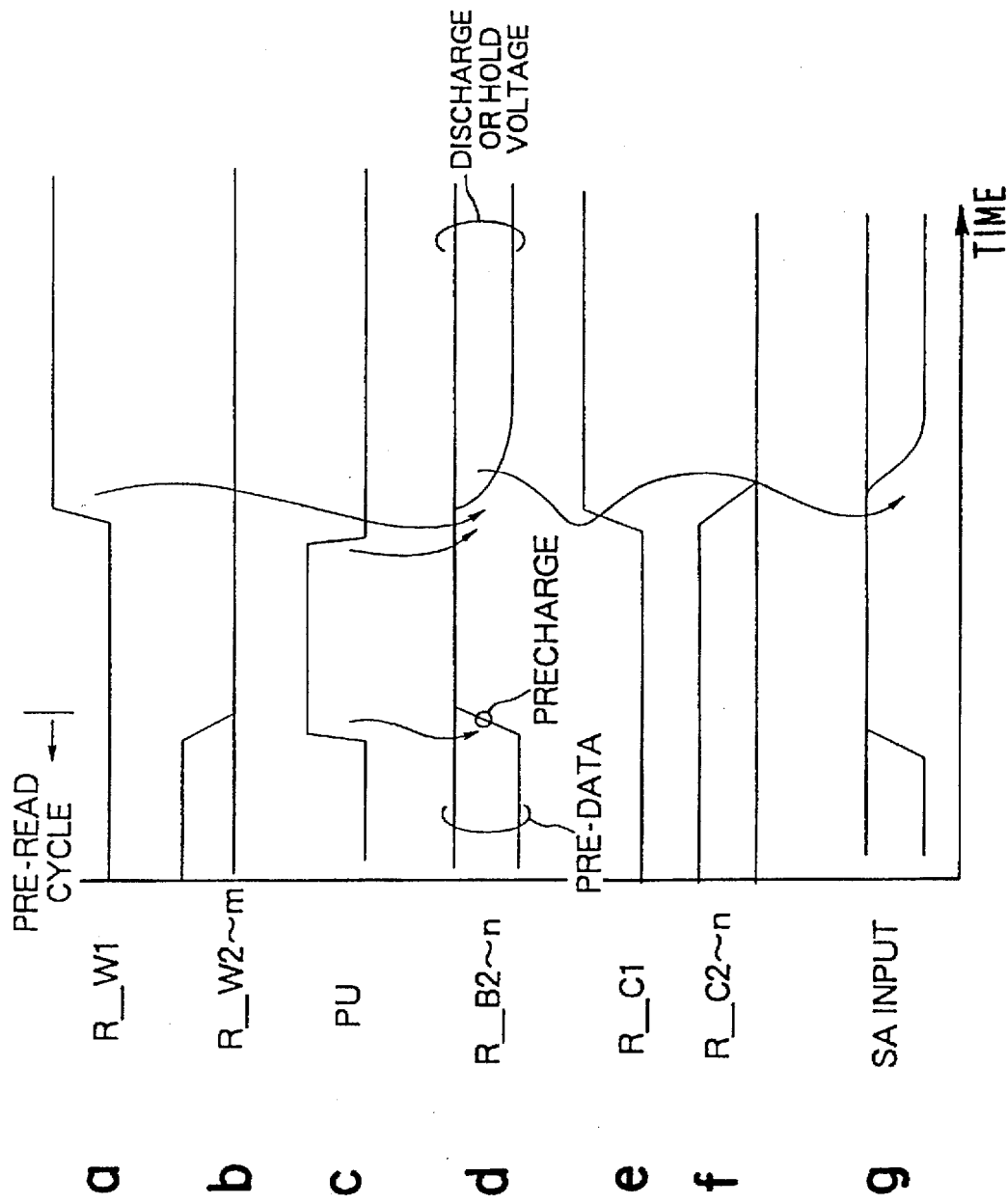
FIG. 2 is a timing chart for explaining the operation of the circuit in FIG. 1.
Figure 3:
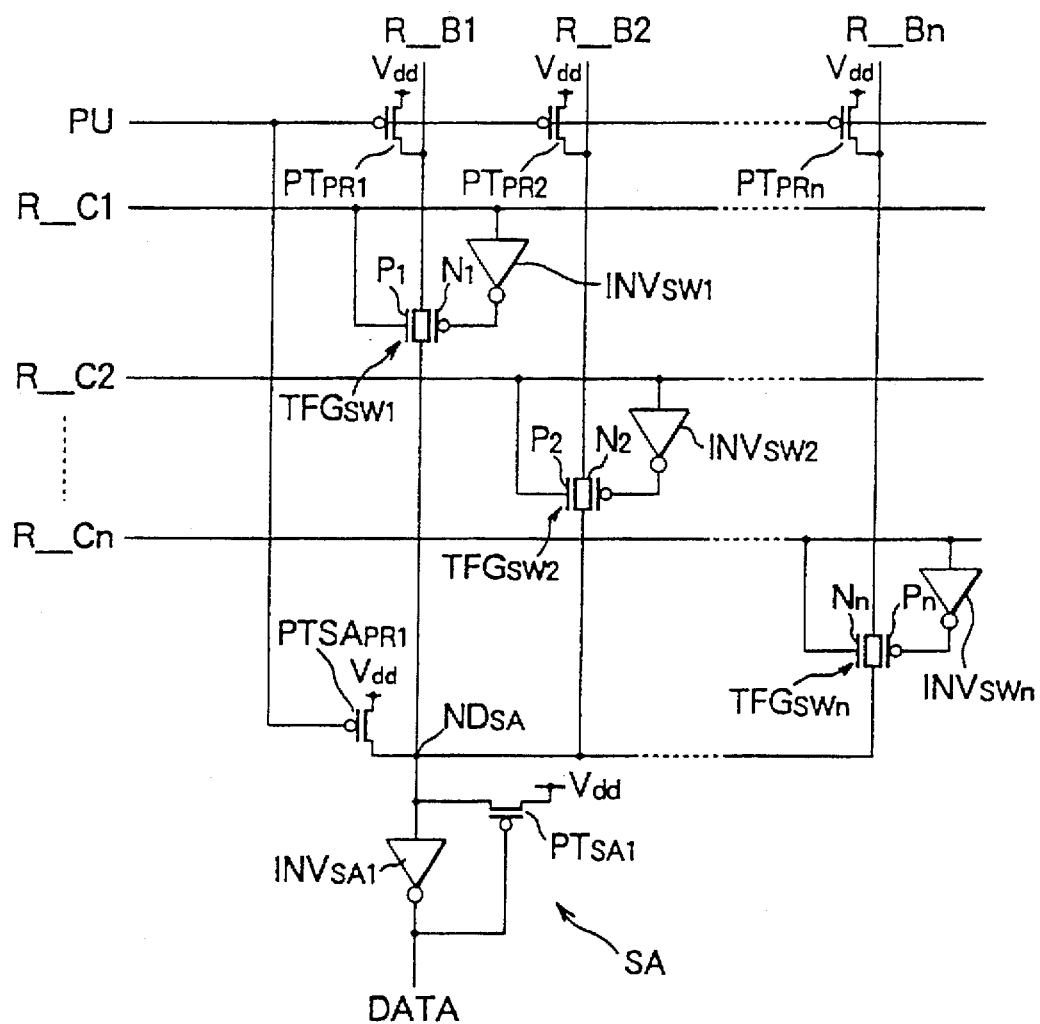
FIG. 3 is a circuit diagram of a second example of a semiconductor memory apparatus of the related art.
Figure 4:
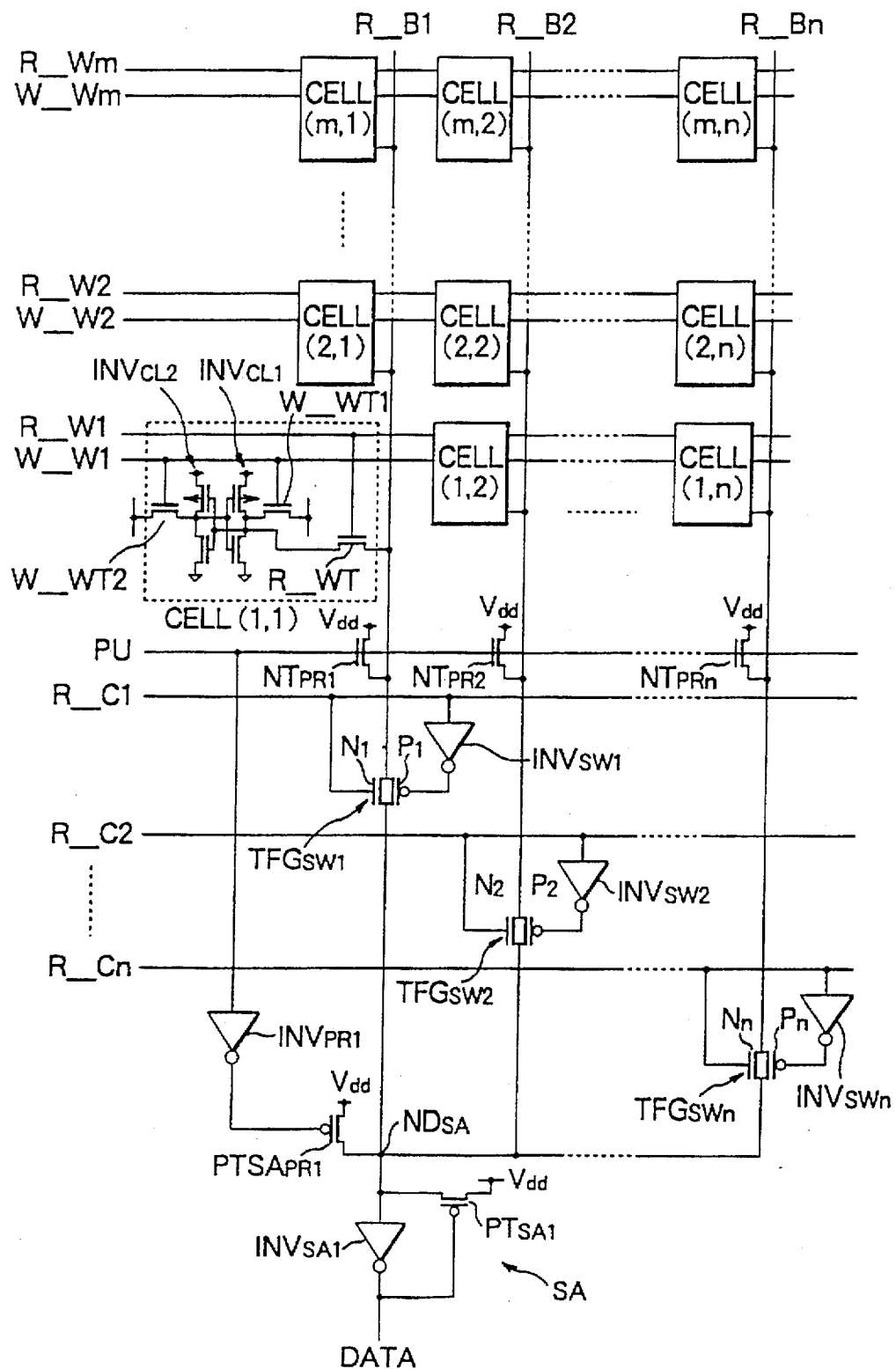
FIG. 4 is a circuit diagram of a first embodiment of a semiconductor memory apparatus according to the present invention.

FIG. 4 is a circuit diagram of a first embodiment of a semiconductor memory apparatus according to the present invention.

In FIG. 4, CELL(1,1) to CELL(m,n) represent SRAM cells arranged in a matrix of m lines and n rows, R__B1 and R__B2 to R__Bn represent read bit lines, R__W1 and R__W2 to R__Wm represent read word lines, W__W1 and W__W2 to W__Wm represent write word lines, $NT_{PR1}$ and $NTPR_2$ to $NT_{PRn}$ represent NMOS transistors for precharging the bit lines, $PTSA_{PR1}$ represents a PMOS transistor for precharging an input node of a sense amplifier, $INV_{PR1}$ represents an inverter for precharging, $TFG_{SW1}$ and $TFG_{SW2}$ to $TFG_{SWn}$ represent transfer gates functioning as column switches, PU represents a precharge signal supply line, R__C1 and R__C2 to R__Cn represent column switch supply lines, SA represents a sense amplifier.

The drains of the precharging NMOS transistors $NT_{PR1}$ and $NT_{PR2}$ to $NT_{PRn}$ are connected to the supply lines of the power supply voltage Vdd respectively, and the gates of the NMOS transistors $NT_{PR1}$ and $NT_{PR2}$ to $NT_{PRn}$ are connected to a common precharge signal supply line PU.

The source of the NMOS transistor $NT_{PR1}$ is connected to the read bit line R__B1, the source of the NMOS transistor $NT_{PR2}$ is connected to the read bit line R__B2, and the source of NMOS transistor $NT_{PRn}$ is connected to the read bit line R__Bn.

The drain of the PMOS transistor $PTSA_{PR1}$ precharging the input node of the sense amplifier SA is connected to the supply line of the power supply voltage Vdd. The source thereof is connected to the node $ND_{SA}$, which is a connection point between the read bit lines R__B1 and R__B2 to R__Bn and the sense amplifier SA, and the gate thereof is connected to the output of the inverter $INV_{PR1}$. The input of the inverter $INV_{PR1}$ is connected to the precharge signal supply line PU.

The transfer gate $TFG_{SW1}$ used as a column switch is provided between a connection point of the read bit line R__B1 and the source of the NMOS transistor $NT_{PR1}$ and the input node $ND_{SA}$ of the sense amplifier SA. The gate of the NMOS transistor $N_1$ forming the transfer gate $TFG_{SW1}$ is connected to the column switch signal supply line R__C1, the gate of the PMOS transistor $P_1$ also forming the transfer gate $TFG_{SW1}$ is connected to the output of the inverter $INV_{SW1}$, and the input of the inverter $INV_{SW1}$ is connected to the column switch signal supply line R__C1.

The transfer gate $TFG_{SW2}$ used as a column switch is provided between a connection point of the read bit line R__B2 and the source of the NMOS transistor $NT_{PR2}$ and the input node $ND_{SA}$ of the sense amplifier SA. The gate of the NMOS transistor $N_2$ forming the transfer gate $TFG_{SW2}$ is connected to the column switch signal supply line R__C2, the gate of the PMOS transistor $P_2$ also forming the transfer gate $TFG_{SW2}$ is connected to the output of the inverter $INV_{SW2}$, and the input of the inverter $INV_{SW2}$ is connected to the column switch signal supply line R__C2.

The transfer gate $TFG_{SWn}$ used as a column switch is provided between a connection point of the read bit line R__Bn and the source of the NMOS transistor $NT_{PRn}$ and the input node $ND_{SA}$ of the sense amplifier SA. The gate of the NMOS transistor $N_n$ forming the transfer gate $TFG_{SWn}$ is connected to the column switch signal supply line R__Cn, the gate of the PMOS transistor $P_n$ also forming the transfer gate $TFG_{SWn}$ is connected to the output of the inverter $INV_{SWn}$, and the input of the inverter $INV_{SWn}$ is connected to the column switch signal supply line R__Cn.

The sense amplifier SA is comprised of an inverter $INV_{SA1}$ and a PMOS transistor $PT_{SA1}$.

The input of the inverter $INV_{SA1}$ is connected to the node $ND_{SA}$ which is a connection point between the bit lines R__B1 and R__B2 to R__Bn and the drain of the PMOS transistor $PT_{SA1}$. The output of the inverter $INV_{SA1}$ functions as the output of the sense amplifier SA and is connected to the gate of the PMOS transistor $PT_{SA1}$. The source of the PMOS transistor $PT_{SA1}$ is connected to the supply line of the power supply voltage Vdd.

Figure 5:
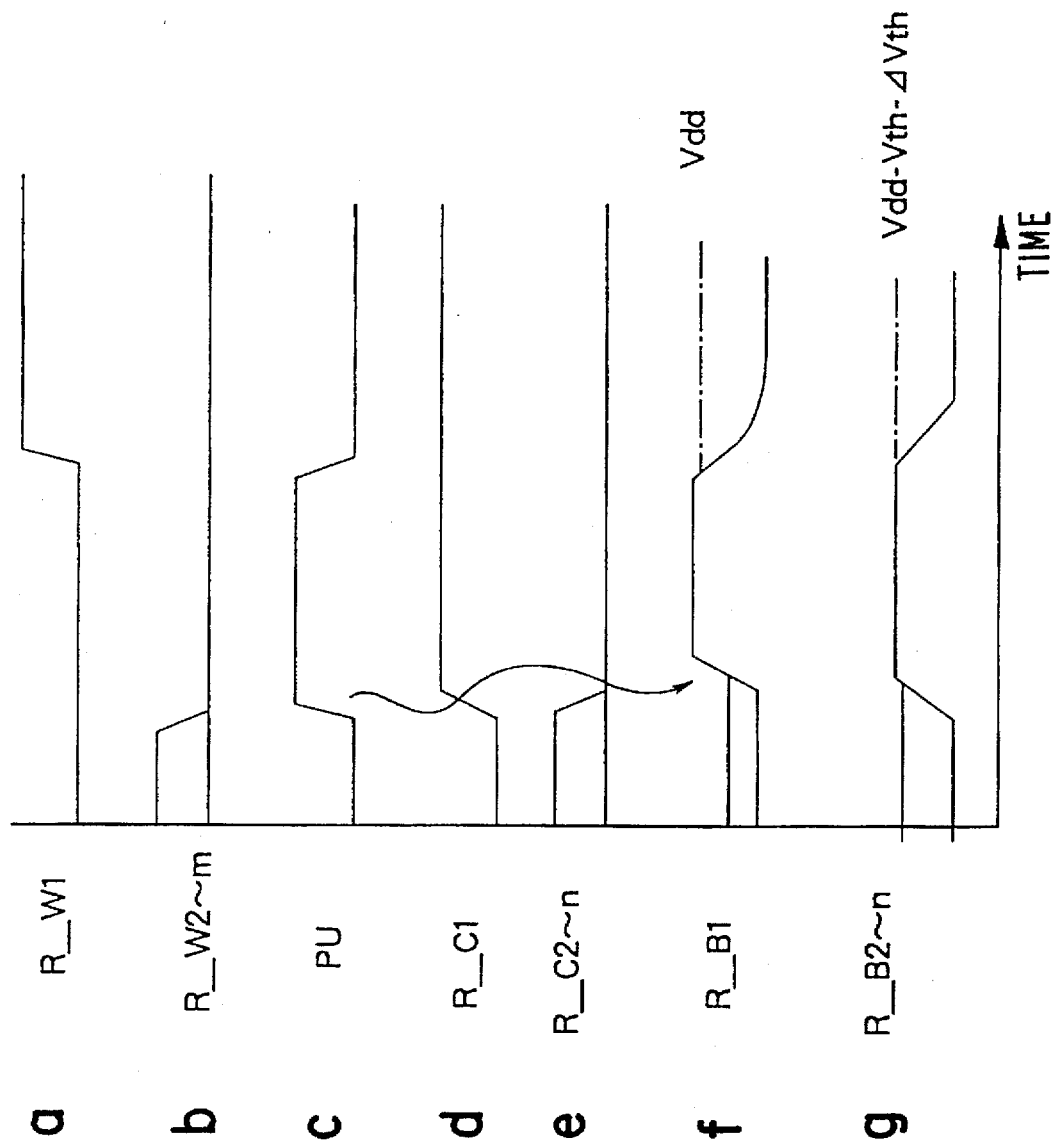
FIG. 5 is a timing chart for explaining the operation of the circuit in FIG. 4.

Next, an explanation will be made of the operation when only the bit line R__B1 is precharged to the power supply voltage Vdd level, with reference to the timing chart in FIG. 5.

First, the read word lines R__W1 to R__Wn are set to a low level. The precharge signal supply line PU and the column switch signal supply line R__C1 are set to a high level. As a result, the NMOS transistors $NT_{PR1}$ to $NT_{PRn}$ are turned ON, the bit lines R__B1 to R__Bn are precharged at a high level, the transfer gate $TFG_{SW1}$ is turned ON, and the other transfer gate $TFG_{SW2}$ to $TFG_{SWn}$ are still held at on OFF state. At the time, the actual precharge level of the bit lines R__B1 to R__Bn is (VDD–Vth–$\Delta$Vth), where Vth is the threshold voltage of the transistor, and $\Delta$Vth is the change of threshold voltage due to the substrate bias effect.

As the precharge signal supply line PU is set to a high level, and the gate of the PMOS transistor $PTSA_{PR1}$ is supplied with a low level signal inverted by the inverter $IN_{PR1}$, the PMOS transistor $PTSA_{PR1}$ is turned ON, and the connection point of bit lines R__B1 to R__Bn and the sense amplifier SA, namely, the input node $ND_{SA}$ of the sense amplifier SA, is precharged at a high level.

As the precharging transistor is the PMOS transistor, the precharge level of the node $ND_{SA}$ is the Vdd level. At this time, as only the transfer gate $TFG_{SW1}$ provided in the bit line R__B1, among the transfer gates serving as the column switches in the bit lines R_B1 to R_Bn, is in an ON state, the precharged level of the bit line R_B1 becomes the Vdd level. The other bit lines R_B2 to R_Bn are held at a level of (Vdd−Vth−ΔVth).

Next, the level of the precharge signal supply line PU is changed from a high level to a low level, and the read word line R_W1 selected by the address signal is set to a high level. As a result, the NMOS transistors $NT_{PR1}$ to $NT_{PRn}$ and the PMOS transistor $PTSA_{PR1}$ are turned OFF.

In accordance with the data stored in the SRAM cells CELL(i,1) to CELL(i,n), which are connected to the read word line R_W1 set to the high level, the read bit lines R_B1 to R_Bn are discharged to a low level or are held at a high level.

As explained above, in the present embodiment, the semiconductor memory device (apparatus) is provided with (a) the NMOS transistors $NT_{PR1}$ to $NT_{PRn}$ for precharging the bit lines and connected between the supply lines of the power supply voltage Vdd and the bit lines R_B1 to R_Bn, the gates thereof being connected to the common precharge signal supply line PU, (b) the PMOS transistor $PTSA_{PR1}$, connected to the node ND, which is the connection point of the bit R_B1 to R_Bn and the sense amplifier SA, the gate thereof being connected to the precharge signal supply line PU through the inverter $INV_{PR1}$, and (c) the transfer gates $TFG_{SW1}$ to $TFG_{SWn}$ provided between the node $ND_{SA}$ and a connection point of the bit lines R_B1 to R_Bn and the NMOS transistors $NO_{PR1}$ to $NO_{PR2}$, the gates connected to the column switch signal supply lines R_C1 to R_Cn. In the semiconductor memory apparatus, only the precharge signal and the column switch signal supply line of the selected column are set to a high level, only the bit of the selected column is precharged at the power supply voltage Vdd, and the other non-selected bit lines are held at the level (Vdd−Vth−ΔVth) lower than the voltage Vdd. Accordingly, it is possible to operate the sense amplifier at a low voltage and prevent the increase of the operating current due to charging and discharging.

Note that, in the present embodiment, an explanation was made of a semiconductor memory apparatus, of a single read bit line system wherein a single part is used for reading data but the present invention can be applied to multiple port semiconductor memory apparatuses as well.

Further, in the present embodiment, an explanation was made of SRAM cells as memory cells, but the present invention can be applied to other memory cells with bit lines requiring recharging.

Figure 6:
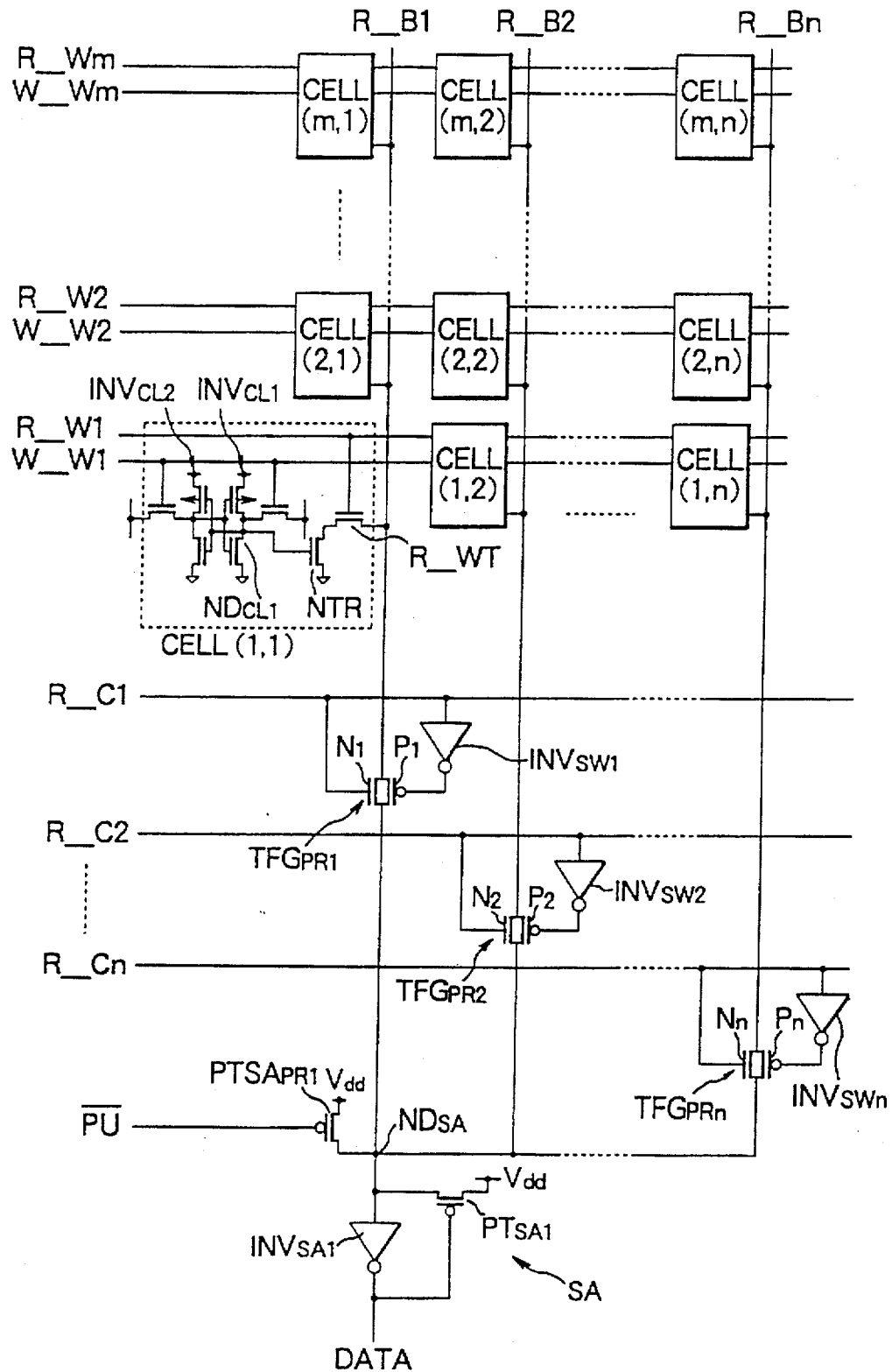
FIG. 6 is a circuit diagram of a second embodiment of a semiconductor memory apparatus according to the present invention.

FIG. 6 is a circuit diagram of a second embodiment of a semiconductor memory apparatus according to the present invention.

The differences of this embodiment from the first embodiment are that instead of providing the precharging NMOS transistors $NT_{PR1}$ to $NT_{PRn}$, an NMOS transistor NTR for preventing the destruction of data is provided in each of the SRAM cells CELL(1,1) to CELL(m,n), the precharge signal is activated at a low level, and the precharge signal supply line PU_ is directly connected to the gate of the PMOS transistor $PTSA_{PR1}$ for precharging the input node of the sense amplifier SA.

In the concrete configuration of the SRAM cell in the present embodiment, the NMOS transistor NTR is provided between the word transistor R_WT connected to the corresponding bit line among the bit lines R_B1 to R_Bn and the ground, and the gate of the NMOS transistor NTR is connected to the memory node $ND_{CL1}$ of the memory cell.

In the configuration as well, unless all bit lines R_B1 to R_Bn are precharged to the predetermined potential, the data stored in the memory cells are not destroyed by providing the NMOS transistor. Thus, actually, only the bit line of the selected column is precharged.

Next, an explanation will be made of the operation when only the bit line R_B1 is precharged to the power supply voltage level, with reference to the timing chart in FIG. 7.

First, the read word lines R_W1 to R_Wn are set to a low level, only the column switch signal supply line r_C1 is set to a high level, and the precharge signal supply line PU_ is set to a low level. As a result, the transfer gate $TFG_{SW1}$ is turned ON, the other transfer gates $TFG_{SW2}$ to $TFG_{SWn}$ are held at the OFF state, the PMOS transistor $PTSA_{PR1}$ is turned ON, and the input node $ND_{SA}$ of the sense amplifier SA, which is a connection point of the bit lines R_B1 to R_Bn and the sense amplifier SA, is precharged to a high level. As the precharging transistor is the PMOS transistor, the precharge level of the node $ND_{SA}$ is the Vdd level.

At this time, as only the transfer gate $TFG_{SW1}$ provided in the bit line R_B1 among the transfer gates as the column switches provided in the bit lines R_B1 to R_Bn is in the ON state, only the bit line R_B1 is precharged to the Vdd level. The previous data remain on the other bit lines R_B2 to R_Bn.

Next, the level of the precharge signal supply line PU is changed from a low level to a high level, and the read word line R_W1 selected by the address signal is set to a high level. As a result, the PMOS transistor $PYSA_{PR1}$ is turned OFF.

As explained above, according to the present embodiment, in addition to the effects of the first embodiment, there is the advantage that the charging and discharging are carried out with respect to only the bit line of the selected column, so the power consumption can be further reduced.

As explained above, the semiconductor memory apparatus according to the present invention can operate at a low voltage and does not suffer from an increase of the operating current during charging and discharging.

What is claimed is:

1. A semiconductor memory apparatus comprising:
   a plurality of bit lines connected to a plurality of memory cells;
   a plurality of first transistors each of which is connected between an ungrounded, power source line and one of said bit lines, wherein the gates of said transistors are supplied with a common precharge signal;
   a second transistor connected between said power source line and a connection point to which all said bit lines are connected; and
   a plurality of column switches each one of which is connected to one of said bit lines between one of said first transistors and said connection point,
   wherein only one of said column switches which is connected to a bit line of a selected column is made conductive at a time; and
   wherein an operating current of said apparatus is not substantially increased during charging and discharging of said memory cells.

2. A semiconductor memory apparatus as set forth in claim 1, wherein a gate of said second transistor is supplied with said precharge signal through an inverter so that said precharge signal is inverted as received by said gate of said second transistor.

3. A semiconductor memory apparatus as set forth in claim 1, wherein a conductivity of said second transistor is different from that of said first transistors.

4. A semiconductor memory apparatus as set forth in claim 1, further comprising an amplifier connected between said connection point and a data output port.

5. A semiconductor memory apparats as set forth in claim 4, wherein said amplifier comprises:
   an inverter connected between said data output port and said connection point; and
   a third transistor connected between said power source line and said connection point; wherein a gate of said third transistor is connected to said data output port.

6. A semiconductor memory apparatus as set forth in claim 1, further comprising:
   a plurality of column switch supply lines;
   wherein each of said of said column switches comprises:
      an n-type transistor;
      a p-type transistor; and
      an inverter;
      wherein a gate of said n-type transistor is connected to one of said column switch supply lines, and a gate of said p-type transistor is connect to one of said column switch supply lines through said inverter.

7. A semiconductor memory apparatus as set forth in claim 6, wherein said plurality of bit lines is equal in number to said plurality of column switch supply lines; and said n-type transistor and said p-type transistor of each column switch are connected to the same column switch supply line.

8. A semiconductor memory apparatus as set forth in claim 1, further comprising a plurality of read word lines and a plurality of write word lines, wherein one of said read word lines and one of said write word lines are connected to each of said memory cells.

9. A semiconductor memory apparatus as set forth in claim 1, wherein said precharge signal is high during a precharging period such that said first transistors are made conductive.

10. A semiconductor memory apparatus as set forth in claim 2, wherein said precharge signal is high during a precharging period such that said first transistors are made conductive; and further wherein, after said precharging period, said precharge signal is made low such that said second transistor is made non-conductive.

11. A semiconductor memory apparatus as set forth in claim 8, wherein said precharge signal and said plurality of read word lines are low prior to a precharging period.

12. A semiconductor memory apparatus as set forth in claim 1, further comprising:
   a plurality of column switch supply lines each of which is connected to one of said column switches;
   wherein said precharge signal and one of said column switch supply lines for a selected column are high during a precharging period.

* * * * *